United States Patent [19]
Kaneko et al.

[11] Patent Number: 5,519,366
[45] Date of Patent: May 21, 1996

[54] STRIP LINE FILTER

[75] Inventors: Toshimi Kaneko; Masahiko Kawaguchi; Katsuji Matsuta, all of Nagaokakyo, Japan

[73] Assignee: Murata Manufacturing Co., Ltd., Japan

[21] Appl. No.: 252,238

[22] Filed: Jun. 1, 1994

[30]     Foreign Application Priority Data

Jun. 8, 1993 [JP] Japan .................................. 5-137647
Jun. 8, 1993 [JP] Japan .................................. 5-137648

[51] Int. Cl.$^6$ ............................................. H01P 1/20
[52] U.S. Cl. ......................... 333/204; 333/202; 333/185
[58] Field of Search .................................. 333/202, 219, 333/175, 177, 185, 204

[56]          References Cited

U.S. PATENT DOCUMENTS 5,351,020  9/1994  Okamura et al. ....................... 333/175
5,357,227  10/1994  Tonegawa et al. ................. 333/204 X Primary Examiner—Robert Pascal
Assistant Examiner—Darius Gambino
Attorney, Agent, or Firm—Ostrolenk, Faber, Gerb & Soffen

[57]            ABSTRACT

A strip line filter has at least two strip lines and a common ground electrode, and on an end, has a solder ground terminal electrode and at least two link ground terminal electrodes at a distance from the solder ground terminal electrode. The solder ground terminal electrode is electrically connected with the common ground electrode, and the link ground terminal electrodes electrically connect each of the strip lines with the common ground electrode. Another strip line filter has at least two strip lines and a common ground electrode, and on an end, has a ground terminal electrode which has a solder portion and at least two arm portions extending from the solder portion. The ground terminal electrode is electrically connected with the common ground electrode via the solder portion and with the strip lines via the arm portions.

25 Claims, 7 Drawing Sheets

STRIP LINE FILTER

BACKGROUND OF THE INVENTION

1. Field of the Invention

The present invention relates to a strip line filter, and more particularly to a strip line filter used in a communication circuit or the like.

2. Description of Related Art

FIG. 14 shows a conventional strip line filter 101. The strip line filter 101 has an input terminal electrode 102 and an output terminal electrode 103 on mutually opposite ends (right and left ends in FIG. 14) and ground terminal electrodes 104 and 105 on the other mutually opposite ends (front, and rear ends in FIG. 14). The ground terminal electrodes 104 and 105 are to connect strip lines provided inside the filter 101 with a common ground electrode provided on the bottom surface of the filter 101. The ground terminal electrodes 104 and 105 are so large as to cover the respective ends almost entirely. The strip line filter 101 is surface-mounted on a printed board 107. More specifically, as can be seen In FIG. 14, the output terminal electrode 103 and the ground terminal electrode 104 are electrically connected with conductors 108 and 109 on the surface of the printed board 107 respectively by solder 112 and 113 and fixed on the printed board 107. Although it is not drawn, the input terminal electrode 102 and the ground terminal electrode 105 are connected with conductors on the surface of the printed board 107 by solder in the same manner.

When the strip line filter 101 is used in a high-frequency band, residual inductances occur on the ground terminal electrodes 104 and 105. The strengths of the residual inductances depend on the volume and the area of the solder 113. Since the areas of the ground terminal electrodes 104 and 105 are large, it is very difficult to conduct the soldering so as to have a specified volume of solder 113 on a predetermined area. Therefore, the strengths of the residual inductances occurring on the ground terminal electrodes 104 and 105 will not be predicted values, and accordingly the filter characteristic of the strip line filter 101 is likely to be far from a designed one. Thus, strip line filters of this type vary to a great extent in the strengths of residual inductances on the ground terminal electrodes.

SUMMARY OF THE INVENTION

An object of the present invention is to provide strip line filters which do not vary very much in the strengths of residual inductances on the ground terminal electrodes.

In order to attain the object, a strip line filter according to the present invention has at least two strip lines and a common ground electrode, and on an end, a solder ground terminal electrode and at least link ground terminal electrodes at a distance from the solder ground terminal electrode. The solder ground terminal electrode is electrically connected with the common ground electrode, and the link ground terminal electrodes electrically connect each of the strip lines with the common ground electrode.

The strip line filter is provided with two kinds of ground terminal electrodes, that is, a kind for soldering and a kind For linking. When the strip line filter is surface-mounted on a printed board, only the solder ground terminal electrode is soldered to a conductor on the surface of the printed board, and the link ground terminal electrodes are not soldered. The solder ground terminal electrode has a smaller width than a ground terminal electrode of a conventional strip line filter, and accordingly the volume and the area of solder on the electrode become less. Additionally, since the link ground terminal electrodes are not soldered, the strengths of residual inductances occurring on the ground terminal electrodes depend on the lengths of current passages from the common ground electrode to the strip lines via the link ground terminal electrodes.

Another strip line filter according to the present invention has at least two strip lines and a common ground electrode, and on an end, a ground terminal electrode having a solder portion and at least two arm portions which extend from the solder portion. The ground terminal electrode is electrically connected with the common ground electrode via the solder portion and is electrically connected with the strip lines via the arm portions.

When the strip line filter is surface-mounted on a printed board, only the solder portion of the ground terminal electrode is soldered to a conductor on the surface of the printed board, and the arm portions are not soldered. The solder portion of the ground terminal electrode has a smaller width than a ground terminal electrode of a conventional strip line filter, and accordingly, the volume and the area of solder on the electrode become less. Additionally, since the arm portions of the ground terminal electrode are not soldered, the strengths of residual inductances occurring on the ground terminal electrode depend on the lengths of current passages from the common ground electrode to the strip lines via the ground terminal electrode.

BRIEF DESCRIPTION OF THE DRAWINGS

This and other objects and features of the present invention will be apparent from the following description with reference to the accompanying drawings, in which.

DETAILED DESCRIPTION OF THE PREFERRED EMBODIMENTS

Some embodiments of the present invention are described with reference to the accompanying drawings. Each of the embodiments is a micro strip line filter which has two resonators on a dielectric substrate and functions as a band-pass filter.

First Embodiment: FIGS. 1 through 5

Figure 1:
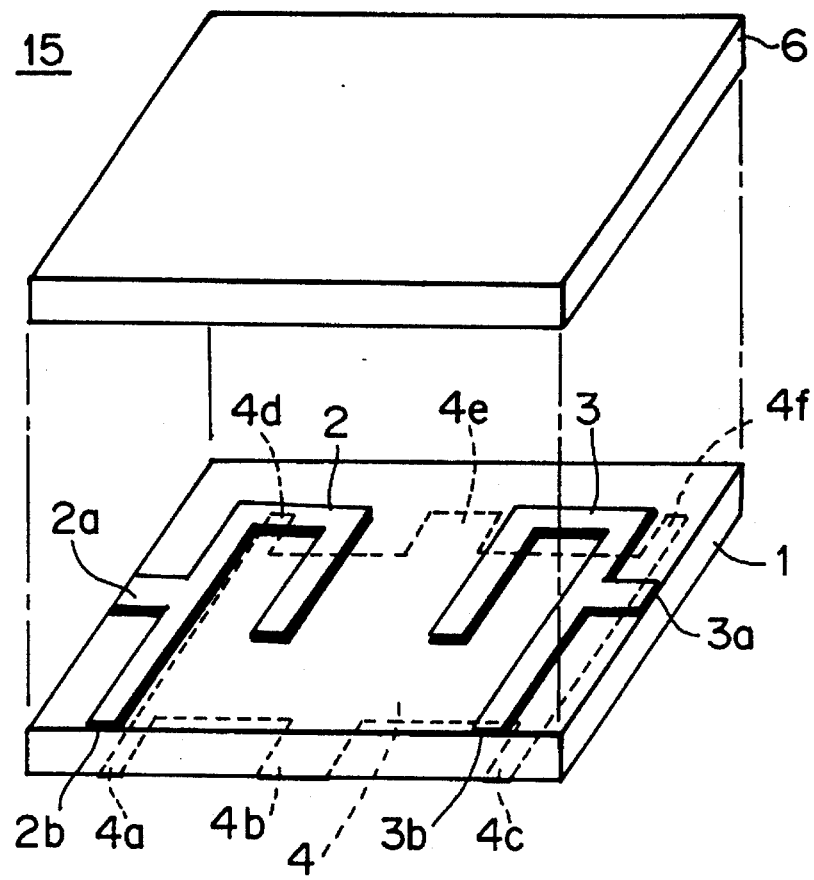
FIG. 1 is an explosive perspective view of a strip line filter which is a first embodiment of the present invention.

Referring to FIG. 1, the internal composition of a First embodiment is described. A couple of strip lines 2 and 3 are formed on an upper surface of a dielectric substrate 1. A lead portion 2a of the strip line 2 extends to a left end of the dielectric substrate 1, and a lead portion 2b thereof extends to a front end, in the left, of the dielectric substrate 1. A head portion 3a of the strip line 3 extends to a right end of the dielectric substrate 1, and a lead portion 3b thereof extends to a front end, in the right, of the dielectric substrate 1. On a lower surface of the dielectric substrate 1, a common ground electrode 4 is formed to cover almost the entire surface. Lead portions 4a, 4b and 4c of the ground electrode 4 extend to the front end of the dielectric substrate 1, in the left, in the center and in the right respectively. Lead portions 4d, 4e and 4f extend to a rear end of the dielectric substrate 1, in the left, in the center and in the right respectively. The strip lines 2 and 3, and the common ground electrode 4 may be formed by a printing method wherein paste of silver, copper or the like is coated and dried, or by a thin-film forming method such as spattering and photolithography. A dielectric substrate 6 is placed on the dielectric substrate 1 and joined thereto by adhesive, and thus, a strip line filter 15 is fabricated.

Figure 2:
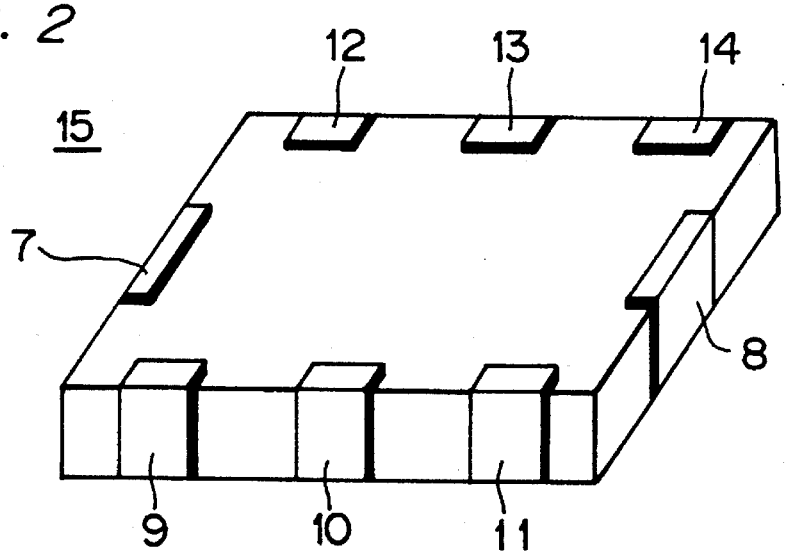
FIG. 2 is a perspective view of the strip line filter of the first embodiment.

Referring to FIG. 2, the appearance of the strip line filter 15 is described. An input terminal electrode 7 is disposed on the left end and is in contact with the lead potion 2a of the strip line 2. An output terminal electrode 8 is disposed on the right end and is in contact with the lead portion 3a of the strip line 3. On the front end of the line strip filter 15, ground terminal electrodes 9, 10 and 11 are disposed in the left, in the center and in the right respectively. The ground terminal electrode 9 is in contact with the lead portion 2b of the strip line 2 and the lead portion 4a of the common ground electrode 4 to serve as a link therebetween. The ground terminal electrode 10 is in contact with the lead portion 4b of the common ground electrode 4 to be used for soldering. The ground terminal electrode 11 is in contact with the lead portion 3b of the strip line 3 and the lead portion 4c of the common ground electrode 4 to serve as a link therebetween. On the rear end of the line strip filter 15, ground terminal electrodes 12, 13 and 14 are disposed in the left, in the center and in the right respectively. The ground terminal electrodes 12, 13 and 14 are in contact with the lead portions 4d, 4e and 4f of the common ground electrode 4 respectively to be used for soldering. Thus, the strip lines 2 and 3 are electrically connected with the common ground electrode 4 through the link ground terminal electrodes 9 and 11 respectively. The terminal electrodes 7 through 14 may be formed by a printing method wherein paste of silver, a mixture of silver and palladium, or the like is coated and dried, or by a thin-film forming method such as spattering and photolithography. The electrodes 7 through 14 can be formed more accurately by a thin-film coating method, and in this case, when the strip line filter 15 is soldered to a printed board, the volume and the area of solder become closer to designed values.

In the first embodiment, the common ground electrode 4, which is disposed on the bottom surface of the filter 15, is coated with a material which inhibit the deposit of solder thereon. Thereby, solder used for mounting of the filter 15 will not be deposited on the common ground electrode 4. The material coated on the common ground electrode 4 is, for example, an insulating resin, ceramics or the like.

Figure 3:
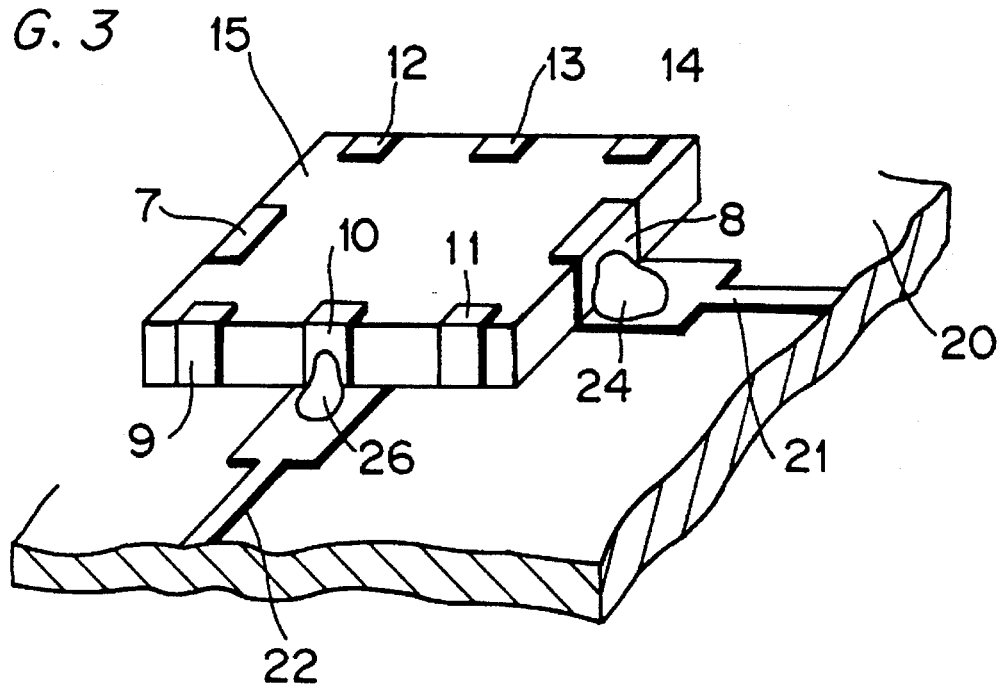
FIG. 3 is a perspective view of the strip line filter shown by FIG. 2 in a state that the strip line filter is surface-mounted on a printed board.

The strip line filter 15 is, for example, surface-mounted on a printed board 20 as shown in FIG. 3. As can be seen in FIG. 3, the output terminal electrode 8 and the solder ground terminal electrode 10 are electrically connected and joined to conductors 21 and 22 on the printed board 20 by solder 24 and 26. Likewise, although it is not drawn, the input terminal electrode 7 and the solder ground terminal electrodes 12, 13 and 14 are electrically connected and joined to conductors on the printed board 20 by solder.

Since the solder ground terminal electrodes 10, 12, 13 and 14 are small, it is easier to conduct the soldering such that the volume and the area of solder 26 will be designed values. In the filter 15, since the link ground terminal electrodes 9 and 11 are not soldered, current passages from the common ground electrode 4 to the strip lines 2 and 3 via the link ground terminal electrodes 9 and 11 can have designed lengths. Therefore, the strengths of residual inductances occurring on the current passages, which depend on the lengths, can be predicted during design of the filter easily, and it is possible to design a circuit of the filter, taking the residual inductances into consideration. Thus, strip line filters produced in this way do not vary very much in the strengths of residual inductances occurring on the ground terminal electrodes 9 through 14.

Figure 4:
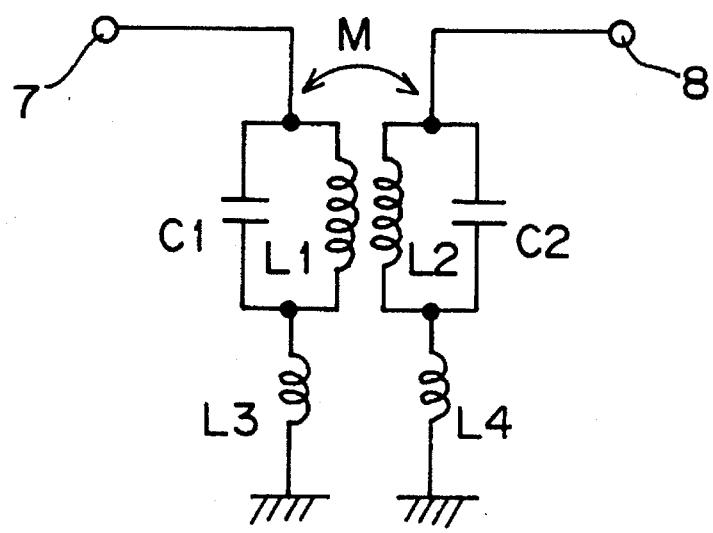
FIG. 4 is an equivalent electrical circuit diagram of the strip line filter shown by FIG. 2.

FIG. 4 is an equivalent electrical circuit diagram of the strip line filter 15. The strip line 2 has an inductance L1, and a capacitance C1 occurs between the strip line 2 and the common ground electrode 4. The inductance L1 and the capacitance C1 form a resonator. The strip line 3 has an inductance L2, and a capacitance C2 occurs between the strip line 3 and the common ground electrode 4. The inductance L2 and the capacitance C2 form another resonator. These resonators are electrically coupled by a mutual inductance M. L3 and L4 denote residual inductances on current passages from the common ground electrode 4 to the strip lines 2 and 3 via the link ground terminal electrodes 9 and 11 respectively. The strengths of the residual inductances L3 and L4 depend on the lengths of the current passages.

Figure 5:
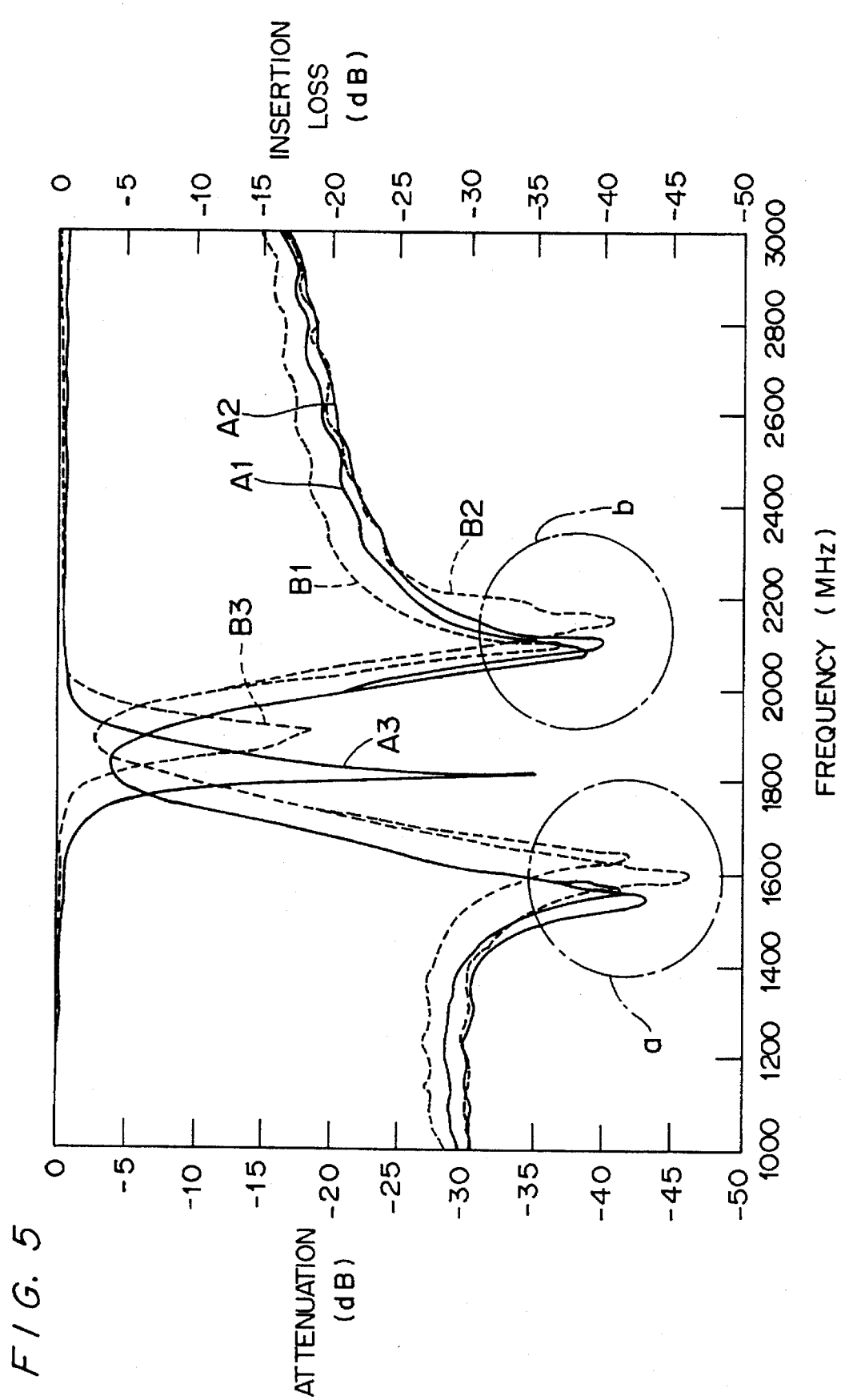
FIG. 5 is a graph showing the band-pass characteristic of the strip line filter in the surface-mounted state.

FIG. 5 shows the band-pass characteristics of the strip line filter 15. Solid lines A1 and A3 indicate the attenuation and the insertion loss of the filter 15 respectively under standard soldering conditions (soldering the filter 15 to the printed board 20 by coating an area of 1.2 mm by 1.5 mm of a conductor on the printed board 20 with solder paste by use of a mask with a thickness of 0.10 mm). A solid line A2 indicates the attenuation of the filter 15 under comparative soldering conditions (soldering the filter 15 to the printed board 20 by coating an area of 1.2 mm by 1.5 mm of a conductor on the printed board 20 with solder paste thickly by use of a mask with a thickness of 0.35 mm). Also, for comparison, the band-pass characteristics of a conventional filter which has a large ground terminal electrode are shown by dashed lines B1, B2 and B3. The dashed lines B1 and B3 indicate the attenuation and the insertion loss of the conventional filter respectively under the standard soldering conditions, and the dashed line B2 indicates the attenuation of the conventional filter under the comparative soldering conditions. Table 1 summarizes the band-pass characteristics of the filter 15 and the conventional filter which are apparent from the graph of FIG. 5. In Table 1, as for each filter, the variations of the filter characteristics between trader the standard soldering conditions and under the comparative soldering conditions are shown.

TABLE 1

Variation of Filter Characteristics with Difference in the Volume of Solder

| | Variation in Pole Positions | Variation in Attenuation (Resonance Frequency - 240 MHz) |
|---|---|---|
| First Embodiment | 10–15 MHz | 1.0–1.5 dB |
| Prior Art | 40–50 MHz | 3.5–5.0 dB |

Concerning the filter 15 of the first embodiment, the pole positions a and b, which are at both sides of the passband, move by only 10 to 15 MHz (1.0 to 1.5 dB in point of attenuation) with the difference in the volume of solder between the two different soldering conditions. On the other hand, concerning the conventional filter, the pole positions a and b move by 40 to 50 MHz (3.5 to 5.0 dB in point of attenuation) with the difference in the volume of solder between the two different soldering conditions. Thus, according to the first embodiment, the variation in the filter characteristics with a difference in the volume of solder can be inhibited to be about 30% of that of a conventional filter.

Second Embodiment: FIGS. 6 through 10

Figure 6:
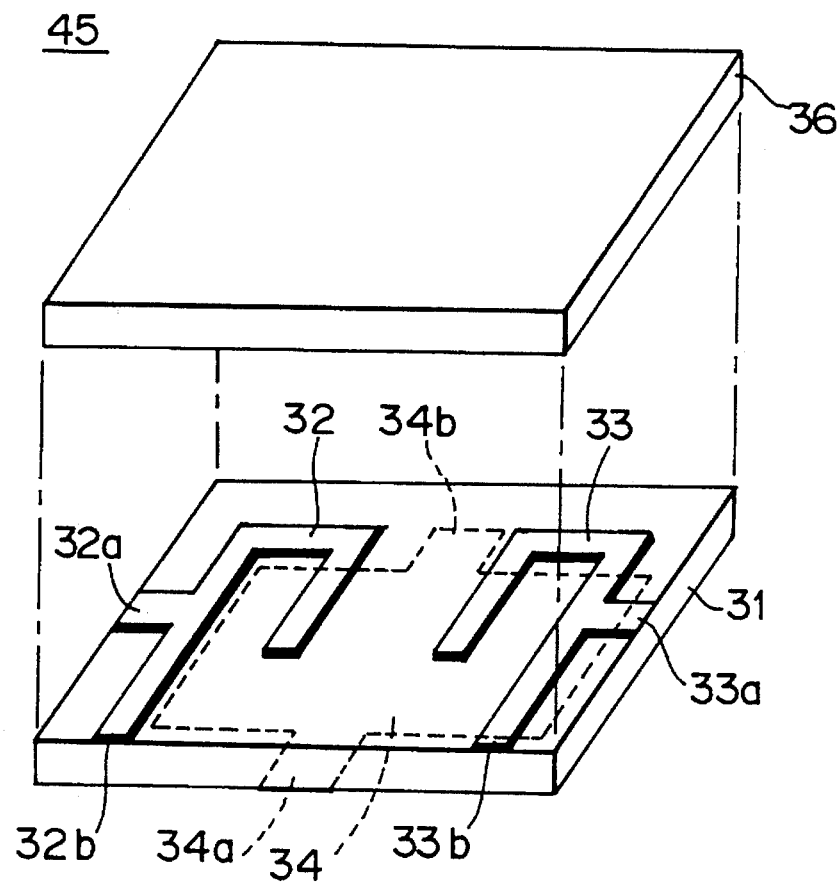
FIG. 6 is an explosive perspective view of a strip line filter which is a second embodiment of the present invention.

Referring to FIG. 6, the internal composition of a second embodiment is described. A couple of strip lines 32 and 33 are formed on an upper surface of a dielectric substrate 31. A lead portion 32a of the strip line 32 extends to a left end of the dielectric substrate 31, and a lead portion 32b thereof extends to a front end, in the left, of the dielectric substrate 31. A lead portion 33a of the strip line 33 extends to a right end of the dielectric substrate 31, and a lead portion 33b thereof extends to the front end, in the right, of the dielectric substrate 31. On a lower surface of the dielectric substrate 31, a common ground electrode 34 is formed to cover almost the entire surface. Lead portions 34a and 34b extend to the front end and to a rear end respectively of the dielectric substrate 31, in the center. A dielectric substrate 36 is placed on the upper surface of the dielectric substrate 31 and joined thereto by adhesive. Thus, a strip line filter 45 is fabricated.

Figure 7:
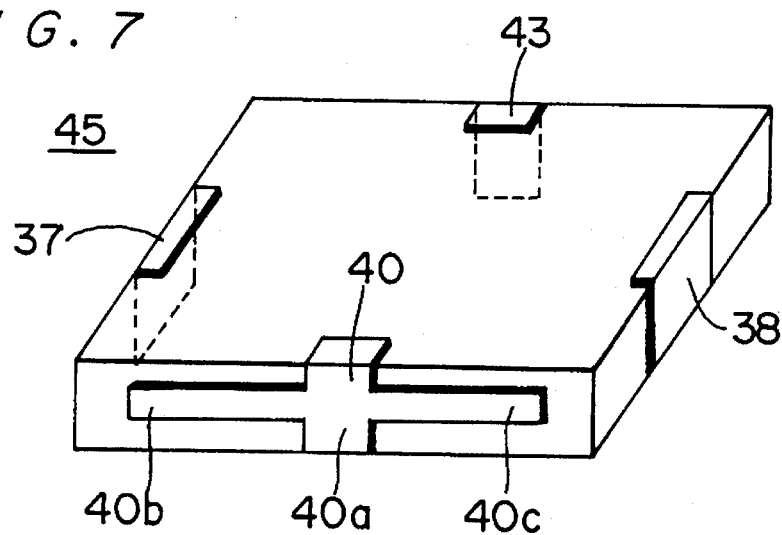
FIG. 7 is a perspective view of the strip line filter off the second embodiment.

Referring to FIG. 7, the appearance of the strip line filter 45 is described. An input terminal electrode 37 is disposed on the left end and is in contact with the lead portion 32a of the strip line 32. An output terminal electrode 38 is disposed on the right end and is in contact with the lead portion 33a of the strip line 33. A ground terminal electrode 40 is disposed on the front end. The ground terminal electrode 40 has a solder portion 40a and arm portions 40b and 40c which extend from the solder portion 40a. The width of the arm portions 40b and 40c is smaller than that of the solder portion 40a. Thereby, solder coated on the solder portion 40a will not spread to the arm portions 40b and 40c easily. The arm portion 40b is in contact with the lead portion 32b of the strip line 32. The solder portion 40a is in contact with the lead portion 34a of the common ground electrode 34. The arm portion 40c is in contact with the lead portion 33b of the strip line 33. A ground terminal electrode 43 is disposed on the rear end and is in contact with the lead portion 34b of the common ground electrode 34. Thus, the strip lines 32 and 33 are electrically connected with the common ground electrode 34 via the ground terminal electrode 40.

In the second embodiment, the common ground electrode 34, which is disposed on the bottom surface of the filter 45, is coated with a material which is difficult for solder to deposit on. Thereby, solder used for mounting of the filter 45 will not be deposited on the common ground electrode 34.

Figure 8:
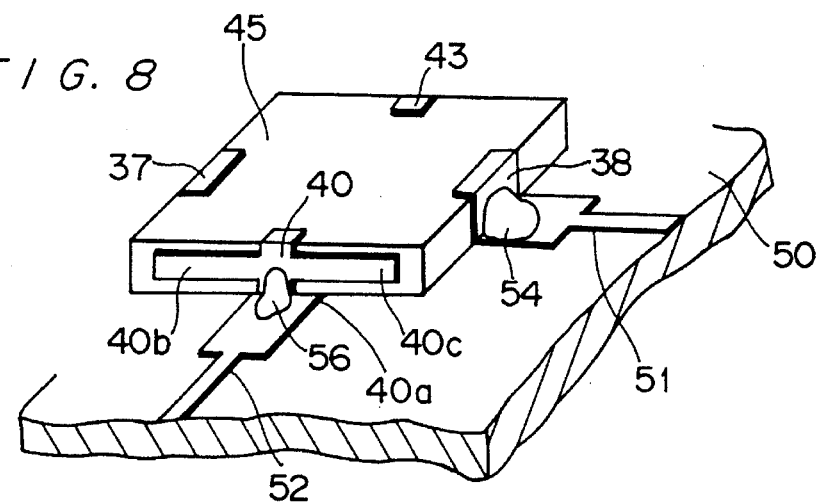
FIG. 8 is a perspective view of the strip line filter shown by FIG. 7 in a state that the strip line filter is surface-mounted on a printed board.

The strip line filter 45 is, for example, surface-mounted on a printed board 50 as shown in FIG. 8. More specifically, as can be seen in FIG. 8, the output terminal electrode 38 and the ground terminal electrode 40 are electrically connected and joined to conductors 51 and 52 on the surface of the printed board 50 by solder 54 and 56. At that time, the solder 56 is deposited on the solder portion 40a of the ground terminal electrode 40 but is not deposited on the arm portions 40b and 40c. Likewise, although it is not drawn, the input terminal electrode 37 and the ground terminal electrode 43 are electrically connected and joined to conductors on the surface of the printed board 50 by solder.

Since the solder portion 40a of the ground terminal electrode 40 is small, it is easier to conduct the soldering such that the volume and the area of solder 26 will be designed values. Since the arm portions 40b and 40c of the ground terminal electrode 40 are not soldered, current passages from the common ground electrode 34 to the strip lines 32 and 33 via the ground terminal electrode 40 can have designed lengths. Therefore, the strengths of residual inductances occurring on the current passages, which depend on the lengths, can be predicted during design of the filter easily, and it is possible to design a circuit of the filter, taking the residual inductances into consideration. Thus, strip line filters produced in tills way do not vary very much in the strengths of residual inductances occurring on the ground terminal electrode 40.

Figure 9:
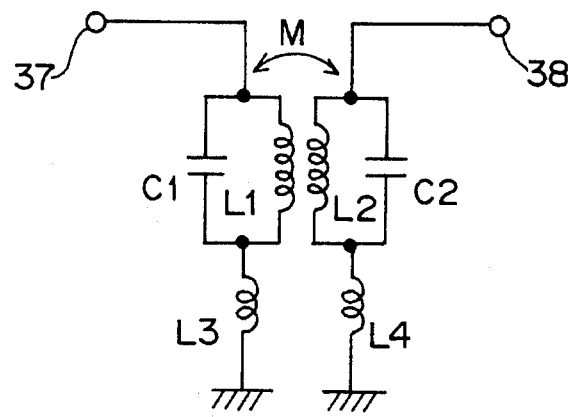
FIG. 9 is an equivalent electrical circuit diagram of the strip line filter shown by FIG. 7.

FIG. 9 is an equivalent electrical circuit diagram of the strip line filter 45. The strip line 32 has an inductance L1, and a capacitance C1 occurs between the strip line 32 and the common ground electrode 34. The inductance L1 and the capacitance C1 form a resonator. The strip line 33 has an inductance L2, and a capacitance C2 occurs between the strip line 33 and the common ground electrode 34. The inductance L2 and the capacitance C2 form another resonator. These resonators are electrically coupled by a mutual inductance M. L3 and L4 denote residual inductances occurring on current passages from the common ground electrode 34 to the strip lines 32 and 33 via the ground terminal electrode 40. The strengths of the residual inductances L3 and L4 depend on the lengths of the current passages.

Table 2 shows variation In the band-pass characteristics of the strip line filter 45 between under standard soldering conditions and under comparative soldering conditions. The standard soldering conditions and the comparative soldering conditions are those described in connection with the first embodiment. Also, for comparison, variation in the band-pass characteristics of a conventional filter which has a large ground terminal electrode is shown. Values in Table 2 were obtained from a graph like the graph of FIG. 5.

TABLE 2

Variation of Filter Characteristics
with Difference in the Volume of Solder

| | Variation in Pole Positions | Variation in Attenuation (Resonance Frequency - 240 MHz) |
| --- | --- | --- |
| Second Embodiment | 15–20 MHz | 1.5–2.5 dB |
| Prior Art | 40–50 MHz | 3.5–5.0 dB |

Concerning the filter 45 of the second embodiment, the pole positions a and b, which are at both sides of the passband, move by only 15 to 20 MHz (1.5 to 2.5 dB in point of attenuation) with the difference in the volume of solder between the two different conditions. Concerning the conventional filter, on the other hand, the pole positions a and b move by 40 to 50 MHz (3.5 to 5.0 dB in point of attenuation). Thus, according to the second embodiment, the variation in the filter characteristics with a difference in the volume of solder can be inhibited to be about 40% of that of a conventional filter.

Figure 10:
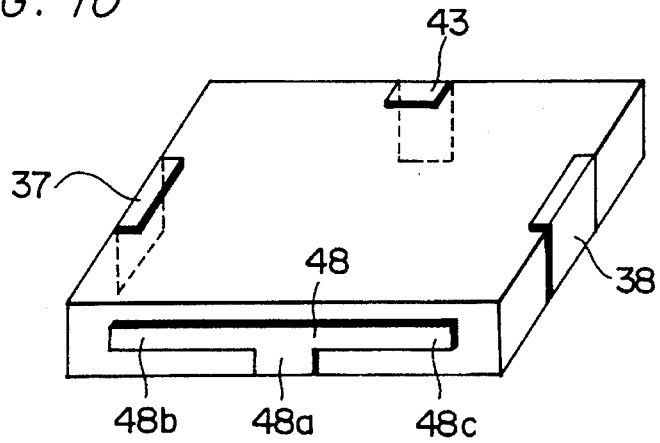
FIG. 10 is a perspective view of a modification of the strip line filter shown by FIG. 7.

The ground terminal electrode with the arm portions may be of any configuration in accordance with the specification of the strip line filter. For example, as shown in FIG. 10, the ground terminal electrode can be made to be T-shaped 48, formed of a solder portions 48a and arm portions 48b and 48c.

Figure 11:
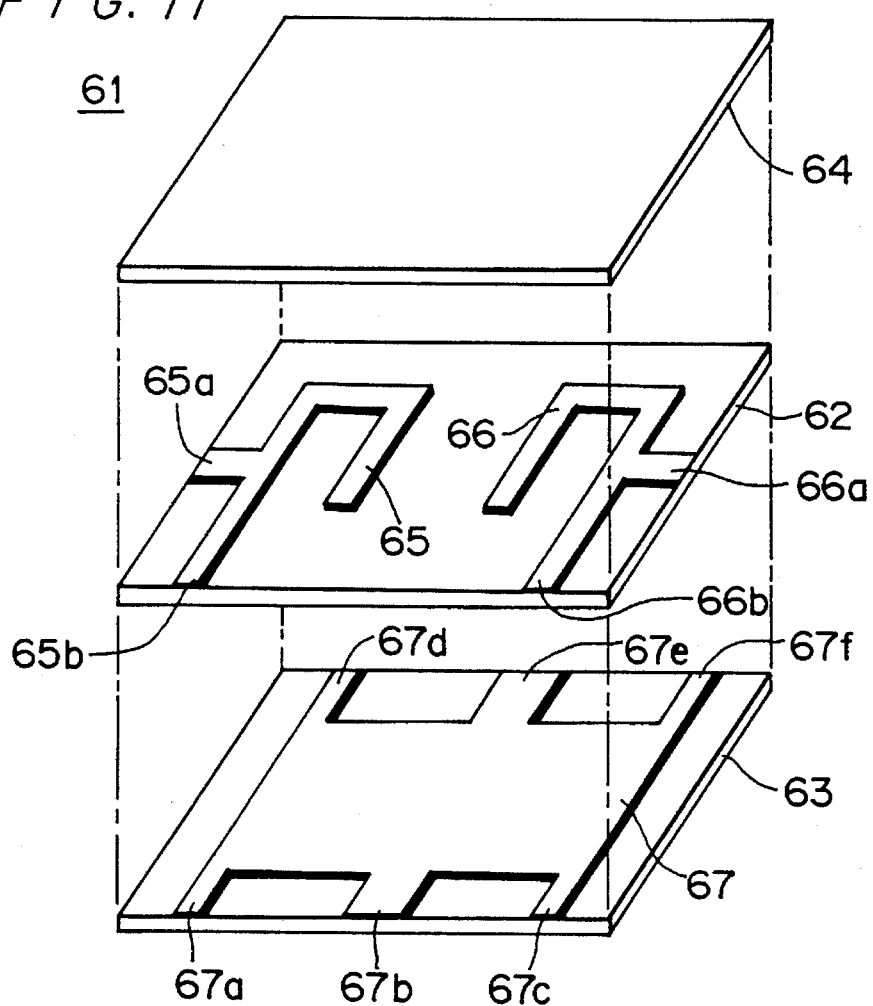
FIG. 11 is an explosive perspective view of a strip line filter which is a third embodiment of the present invention.
Figure 12:
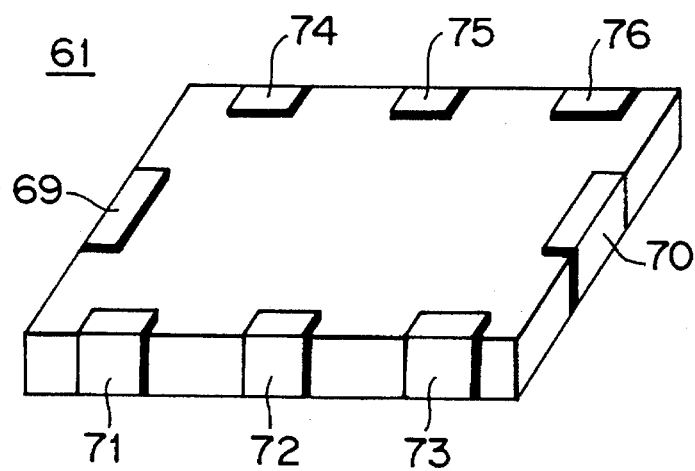
FIG. 12 is a perspective view of the strip line filter shown by FIG. 11.

Third Embodiment: FIGS. 11 and 12

Referring to FIG. 11, the internal composition of a strip line filter 61 of a third embodiment is described. A dielectric green sheet 62 which has strip lines 65 and 66 on a surface, a dielectric green sheet 63 which has a common ground electrode 67 on a surface and a dielectric green sheet 64 are laminated. The laminated green sheets are pressed and sintered to be a unified body.

A lead portion 65a of the strip line 65 extends to a left end of the dielectric green sheet 62, and a lead portion 65b thereof extends to a front end, in the left, of the dielectric green sheet 62. A lead portion 66a of the strip line 66 extends to a right end of the dielectric green sheet 62, and a lead portion 66b thereof extends to the front end, in the right of the dielectric green sheet 62. Lead portions 67a, 67b and 67c of the common ground electrode 67 extend to the front end of the dielectric green sheet 63, in the left, in the center and in the right respectively. Further, lead portions 67d, 67e and 67f of the common ground electrode 67 extend to a rear end of the dielectric green sheet 63, in the left, in the center and in the right respectively.

Referring to FIG. 12, the appearance of the strip line filter 61 is described. An input terminal electrode 69 is disposed on the left end of the strip line filter 61 and is in contact with the lead portion 65a of the strip line 65. An output terminal electrode 70 is disposed on the right end and is in contact with the lead portions 66a of the strip line 66. A ground terminal electrode 71 is disposed on the front end, in the left, of the strip line filter 61. The ground terminal electrode 71 is in contact with the lead portion 65b of the strip line 65 and the lead portion 67a of the common ground electrode 67 and serves as a link therebetween. A ground terminal electrode 72 is disposed on the front end, in the center, of the strip line filter 61. The ground terminal electrode 72 is in contact with the lead portions 67b of the common ground electrode 67 and is used for soldering. A ground terminal electrode 73 is disposed on the front end, in the right, of the strip line filter 61. The ground terminal electrode 73 is in contact with the lead portion 66b of the strip line 66 and the lead portion 67c of the common ground terminal 67 and serves as a link therebetween. Ground terminal electrodes 74, 75 and 76 are disposed on the rear end, in the left, in the center and in the right, of the strip line filter 61. The ground terminal electrodes 74, 75 and 76 are in contact with the lead portions 67d, 67e and 67f of the common ground electrode 67 respectively and are used for soldering. Thus, the strip lines 65 and 66 are electrically connected with the common ground electrode 67 via the link ground terminal electrodes 71 and 73 respectively.

The strip line filter 61 has the same action and the same effect as the filter 15 of the first embodiment does.

Figure 13:
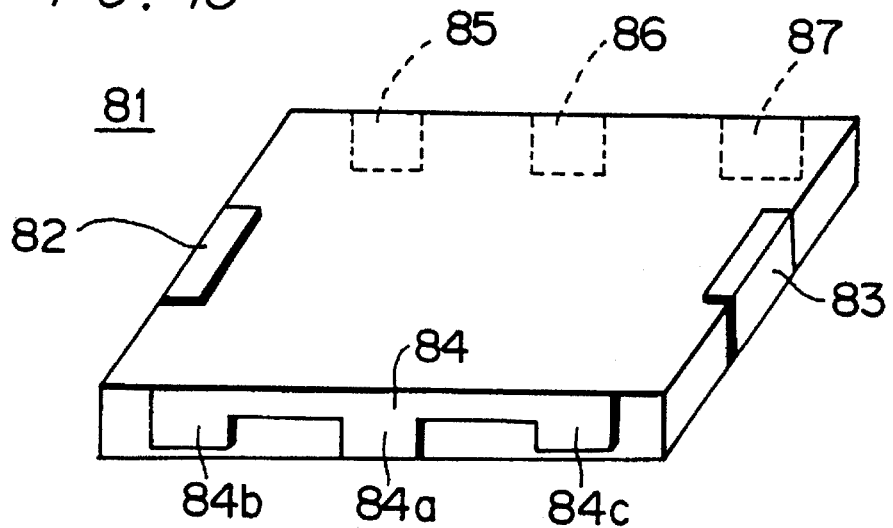
FIG. 13 is a perspective view of a strip line filter which is a fourth embodiment of the present invention.
Figure 14:
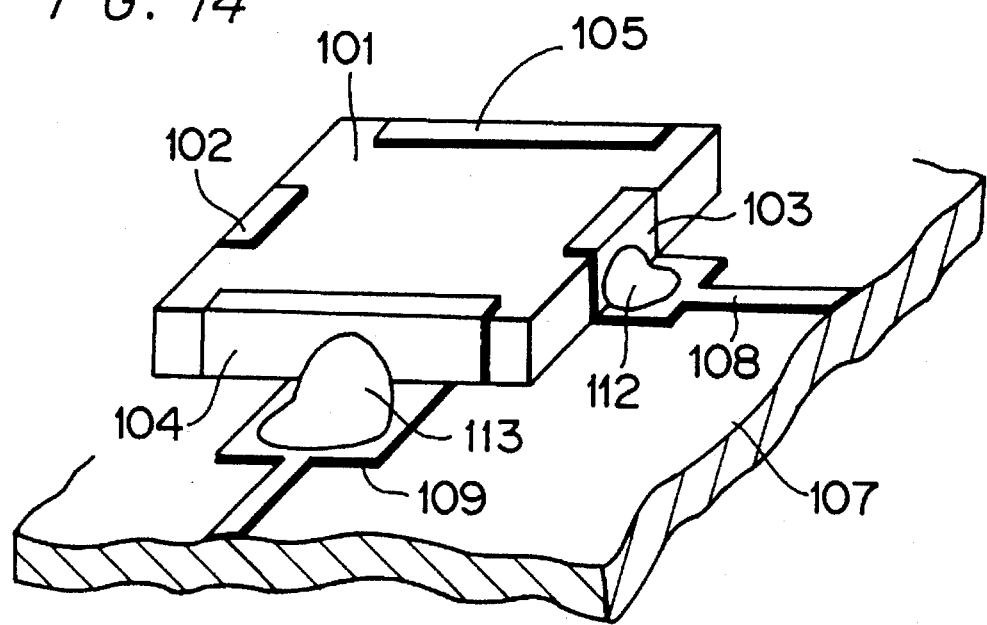
FIG. 14 is a perspective view of a conventional strip line filter.

Fourth Embodiment: FIG. 13

FIG. 13 shows a strip line filter 81 of a fourth embodiment. Like the strip line filter 61 off the third embodiment, the strip line filter 81 comprises the dielectric green sheet 62 with the strip lines 65 and 66, the dielectric green sheet 63 with the common ground electrode 67, and the dielectric green sheet 64. The dielectric green sheets 62, 63 and 64 are laminated, and the laminated green sheets are pressed and sintered to be a unified body. Description of the configurations of the strip lines 65 and 66 and the common ground electrode 67 is omitted.

An input terminal electrode 82 is disposed on the left end of the strip line filter 81 and is in contact with the lead portion 65a of the strip line 65. An output terminal electrode 83 is disposed on the right end of the strip line filter 81 and is in contact with the lead portion 66a of the strip line 66. A ground terminal electrode 84 is disposed on the front end of the strip Line filter 81. The ground terminal electrode 84 has a solder portion 84a, and arm portions 84b and 84c which extend from the solder portion 84a. The arm portion 84b is in contact with the lead portion 65b of the strip line 65 and the lead portion 67a of the common ground electrode 67. The solder portion 84a is in contact with the lead portion 67b of the common ground electrode 67. The arm portion 84c is in contact with the lead portion 66b of the strip line 66 and the lead portion 67c of the common ground electrode 67. Further, ground terminal electrodes 85, 86 and 87 are disposed on the rear end of the strip line filter 81, in the left, in the center and in the right, and are in contact with the lead portions 67d, 67e and 67f of the common ground electrode 67 respectively. Thus, the strip lines 65 and 66 are electrically connected with the common ground electrode 67 via the ground terminal electrode 84.

The strip line filter 81 has the same action and the same effect as the filter 45 of the second embodiment does.

Other Embodiments

In order to certainly prevent deposition of solder on the link ground terminal electrodes, the link ground terminal electrodes may be coated with a material which is difficult for solder to deposit on, such as an insulating resin. Likewise, the arm portions of the ground terminal electrode may be coated with a material which is difficult for solder to deposit on.

The number of solder ground terminal electrodes disposed on one end of a filter may be two or more, and the number of link ground terminal electrodes may be three or more.

In the above embodiments, one or more dielectric substrates having electrodes thereon and a dielectric substrate with no electrodes are bonded by adhesive. There are other processes adoptable for manufacture of the filters. For example, the filters may be manufactured by the following process: first, electrodes are formed on ceramic dielectric green sheets by printing of paste; then, the ceramic dielectric green sheets with electrodes are laminated; and the laminated green sheets are sintered to be unified into a body.

Although the present invention has been described in connection with the preferred embodiments above, it is to be noted that various changes and modifications are possible to those who are skilled in the art. Such changes and modifications are to be understood as being within the scope of the present invention.

What is claimed is:

1. A strip line filter comprising:
   a dielectric substrate having a first surface and a second surface;
   at least two strip lines provided on the first surface of the substrate;
   a common ground electrode provided on the second surface of the substrate;
   a solder ground terminal electrode provided on an end of the substrate, the solder ground terminal electrode being electrically connected with the common ground electrode, and with no electrical connection to the strip lines and soldered to a conductor on a circuit board;
   at least two link ground terminal electrodes provided on the end of the substrate at a distance from the solder ground terminal electrode, the link ground terminal electrodes electrically connecting each of the strip lines with the common ground electrode and not soldered to any conductors on the circuit board;
   an input terminal electrode provided on the substrate, the input terminal electrode being electrically connected with one of the strip lines; and
   an output terminal electrode provided on the substrate, the output terminal electrode being electrically connected with another of the strip lines;
   wherein the link ground terminal electrodes are coated with a material which inhibits the deposit of solder thereon.

2. A strip line filter as claimed in claim 1, wherein the substrate, the strip lines and the common ground electrode form at least two resonators.

3. A strip line filter as claimed in claim 1, further comprising a dielectric substrate which is laid on the first surface of the substrate.

4. A strip line filter comprising:
   a dielectric substrate having a first surface and a second surface;
   at least two strip lines provided on the first surface of the substrate;
   a common ground electrode provided on the second surface of the substrate;
   a solder ground terminal electrode provided on an end of the substrate, the solder ground terminal electrode being electrically connected with the common ground electrode, and with no electrical connection to the strip lines and soldered to a conductor on a circuit board;
   at least two link ground terminal electrodes provided on the end of the substrate at a distance from the solder ground terminal electrode, the link ground terminal electrodes electrically connecting each of the strip lines with the common ground electrode and not soldered to any conductors on the circuit board;
   an input terminal electrode provided on the substrate, the input terminal electrode being electrically connected with one of the strip lines; and
   an output terminal electrode provided on the substrate, the output terminal electrode being electrically connected with another of the strip lines;
   wherein the common ground electrode is coated with a material which inhibits the deposit of solder thereon.

5. A strip line filter as claimed in claim 4, wherein the first and second substrates, the strip lines and the common ground electrode form at least two resonators.

6. A strip line filter comprising:
   a first dielectric substrate with at least two strip lines on a surface;
   a second dielectric substrate with a common ground electrode on a surface;
   a solder ground terminal electrode provided on an end of a laminate of the first substrate and the second substrate, the solder ground terminal electrode being electrically connected with the common ground electrode, and with no electrical connection to the strip lines and soldered to a conductor on a circuit board;
   at least two link ground terminal electrodes provided on the end of the laminate at a distance from the solder ground terminal electrode, the link ground terminal electrodes electrically connecting each of the strip lines with the common ground electrode, and not soldered to any conductor on the circuit board;
   an input terminal electrode provided on the laminate, the input terminal electrode being electrically connected with one of the strip lines; and
   an output terminal electrode provided on the laminate, the output terminal electrode being electrically connected with another of the strip lines;
   wherein the link ground terminal electrodes are coated with a material which inhibits the deposit of solder thereon.

7. A strip line filter as claimed in claim 6, further comprising a dielectric substrate which is laid on the surface of the first substrate.

8. A strip line filter comprising:
   a dielectric substrate having a first surface and a second surface;
   at least two strip lines provided on the first surface of the substrate;
   a common ground electrode provided on the second surface of the substrate;
   a ground terminal electrode provided on an end of the substrate, the ground terminal electrode having a solder portion and at least two arm portions which extend from the solder portion, the ground terminal electrode being electrically connected with the common ground electrode via the solder portion and with the strip lines via the arm portions;
   an input terminal electrode provided on the substrate, the input terminal electrode being electrically connected with one of the strip lines; and
   an output terminal electrode provided on the substrate, the output terminal electrode being electrically connected with another of the strip lines.

9. A strip line filter as claimed in claim 8, wherein the substrate, the strip lines and the common ground electrode form at least two resonators.

10. A strip line filter as claimed in claim 8, wherein the arm portions of the ground terminal electrode are coated with a material which inhibits the deposit of solder thereon.

11. A strip line filter as claimed in claim 8, further comprising a dielectric substrate which is laid on the first surface of the substrate.

12. A strip line filter as claimed in claim 8, wherein the common ground electrode is coated with a material which inhibits the deposit of solder thereon.

13. A strip line filter, comprising:

a first dielectric substrate with at least two strip lines on a surface;

a second dielectric substrate with a common ground electrode on a surface;

a ground terminal electrode provided on an end of a laminate of the first substrate and the second substrate, the ground terminal electrode having a solder portion and at least two arm portions which extend from the solder portion, the ground terminal electrode being electrically connected with the common ground electrode via the solder portion and with the strip lines via the arm portions;

an input terminal electrode provided on the laminate, the input terminal electrode being electrically connected with one of the strip lines; and an output terminal electrode provided on the laminate, the output terminal electrode being electrically connected with another of the strip lines.

14. A strip line filter as claimed in claim 13, wherein the first and second substrates, the strip lines and the common ground electrode form at least two resonators.

15. A strip line filter as claimed in claim 13, wherein the arm portions of the ground terminal electrode are coated with a material which inhibits the deposit of solder thereon.

16. A strip line filter as claimed in claim 13, further comprising a dielectric substrate which is laid on the first surface of the substrate.

17. A combination of a strip line filter and a circuit board, comprising:

a circuit board which has a plurality of conductors thereon:

a dielectric substrate having a first surface and a second surface;

at least two strip lines provided on the first surface of the substrate;

a common ground electrode provided on the second surface of the substrate;

a solder ground terminal electrode provided on an end of the substrate, the solder ground terminal electrode being electrically connected with the common ground electrode, and with no electrical connection to the strip lines;

at least two link ground terminal electrodes provided on the end of the substrate at a distance from the solder ground terminal electrode, the link ground terminal electrodes electrically connecting each of the strip lines with the common ground electrode;

an input terminal electrode provided on the substrate, the input terminal electrode being electrically connected with one of the strip lines; and an output terminal electrode provided on the substrate, the output terminal electrode being electrically connected with another of the strip lines;

wherein, the solder ground terminal electrode, the input terminal electrode and the output terminal electrode are soldered to separate conductors of the circuit board, and the link ground terminal electrodes are not soldered to any conductors of the circuit board.

18. A combination of a strip line filter and a circuit board as claimed in claim 17, wherein the substrate, the strip lines and the common ground electrode form at least two resonators.

19. A combination of a strip line filter and a circuit board as claimed in claim 17, wherein the link ground terminal electrodes are coated with a material which inhibits the deposit of solder thereon.

20. A combination of a strip line filter and a circuit board as claimed in claim 17, wherein the common ground electrode is coated with a material which inhibits the deposit of solder thereon.

21. A combination of a strip line filter and a circuit board, comprising:

a circuit board which has a plurality of conductors thereon;

a first dielectric substrate with at least two strip lines on a surface;

a second dielectric substrate with a common ground electrode on a surface;

a solder ground terminal electrode provided on an end of a laminate of the first substrate and the second substrate, the solder ground terminal electrode being electrically connected with the common ground electrode, and with no electrical connection to the strip lines:

at least two link ground terminal electrodes provided on the end of the laminate at a distance from the solder ground terminal electrode, the link ground terminal electrodes electrically connecting each of the strip lines with the common ground electrode;

an input terminal electrode provided on the laminate, the input terminal electrode being electrically connected with one of the strip lines; and an output terminal electrode provided on the laminate, the output terminal electrode being electrically connected with another of the strip lines;

wherein, the solder ground terminal electrode, the input terminal electrode and the output terminal electrode are soldered to separate conductors of the circuit board, and the link ground terminal electrodes are not soldered to any conductors of the circuit board.

22. A combination of a strip line filter and a circuit board as claimed in claim 21, wherein the first and second substrate, the strip lines and the common ground electrode form at least two resonators.

23. A combination of a strip line filter and a circuit board as claimed in claim 21, wherein the link ground terminal electrodes are coated with a material which inhibits the deposit of solder thereon.

24. A strip line filter as claimed in claim 4, wherein the substrate, the strip lines and the common ground electrode form at least two resonators.

25. A strip line filter as claimed in claim 4, further comprising a dielectric substrate which is laid on the first surface of the substrate.

* * * * *